(12) United States Patent
Chang et al.

(10) Patent No.: US 10,559,473 B2
(45) Date of Patent: Feb. 11, 2020

(54) SEMICONDUCTOR PROCESS FOR IMPROVING LOADING EFFECT IN PLANARIZATION

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/152,366

(22) Filed: Oct. 4, 2018

(65) Prior Publication Data
US 2019/0157097 A1    May 23, 2019

(30) Foreign Application Priority Data
Nov. 21, 2017    (CN) .......................... 2017 1 1163834

(51) Int. Cl.
*H01L 21/02*    (2006.01)
*H01L 21/3105*    (2006.01)
(Continued)

(52) U.S. Cl.
CPC .. *H01L 21/31056* (2013.01); *H01L 21/02118* (2013.01); *H01L 21/02282* (2013.01); *H01L 21/31053* (2013.01); *H01L 21/31058* (2013.01); *H01L 21/76819* (2013.01); *H01L 27/1085* (2013.01); *H01L 27/10897* (2013.01)

(58) Field of Classification Search
CPC ......... H01L 21/02118; H01L 21/02282; H01L 21/31053; H01L 21/31056; H01L 21/31058; H01L 21/76819; H01L 27/1085; H01L 27/10897
See application file for complete search history.

(56) References Cited

U.S. PATENT DOCUMENTS 7,074,691 B2 * 7/2006 Sato .................. H01L 21/76229
                                                                 438/435
9,214,358 B1 * 12/2015 Lin .......................... H01L 29/66
(Continued)

*Primary Examiner* — Jaehwan Oh
(74) *Attorney, Agent, or Firm* — Winston Hsu

(57) ABSTRACT

A semiconductor process for improving loading effects in planarization is provided including steps of forming multiple first protruding patterns on a first region and a second region of a substrate, wherein the pattern density of the first protruding patterns in the first region is larger than the one in the second region, forming a first dielectric layer on the substrate and the first protruding patterns, wherein the first dielectric layer includes multiple second protruding patterns corresponding to the first protruding patterns below, forming a second dielectric layer on the first dielectric layer, performing a first planarization process to remove parts of the second dielectric layer, so that the top surface of the second protruding patterns are exposed, performing an etch process to remove the second protruding patterns of the first dielectric layer, removing the remaining second dielectric layer, and performing another planarization process to the first dielectric layer.

10 Claims, 3 Drawing Sheets

(51) Int. Cl.
*H01L 21/768* (2006.01)
*H01L 27/108* (2006.01)

(56) References Cited

U.S. PATENT DOCUMENTS

| | | |
|---|---|---|
| 2008/0124934 A1 | 5/2008 | Kim |
| 2009/0121296 A1* | 5/2009 | Kwon ................ H01L 21/31053 257/390 |
| 2009/0286384 A1* | 11/2009 | Wu .................... H01L 21/76229 438/584 |
| 2015/0037978 A1* | 2/2015 | Tu ..................... H01L 21/31053 438/692 |
| 2015/0349095 A1 | 12/2015 | Yap |
| 2017/0278712 A1* | 9/2017 | Nien ................. H01L 21/28123 |
| 2018/0337036 A1* | 11/2018 | Weng ...................... G03F 7/168 |

* cited by examiner

SEMICONDUCTOR PROCESS FOR IMPROVING LOADING EFFECT IN PLANARIZATION

BACKGROUND OF THE INVENTION

1. Field of the Invention

The present invention relates generally to a semiconductor process, and more specifically, to a semiconductor process that may improve the loading effects in planarization caused by pattern density difference of various predetermined regions.

2. Description of the Prior Art

Multiple planarization processes, such as a chemical mechanical planarization (CMP) or an etch back process, should be performed during the manufacture of semiconductor integrated circuit to provide flat process surfaces for later process steps. However, with the scaling of semiconductor devices, the requirement for surface uniformity and window of the planarization process becomes more and more strict. Specifically, the larger the differences of pattern density and the height between various regions on the substrate surface, the worse the uniformity of the planarization process. Generally, the region with lower pattern density would be removed by more portions in comparison to the ones with higher pattern density, so that it will obtain a lower planarized surface in comparison to the one of those regions with higher pattern density after the planarization. This phenomenon is referred as loading effect in planarization.

For example, in current architecture of dynamic random access memory (DRAM) with technology nodes smaller than 14 nm, the memory cell region is full of storage capacitor units, while the peripheral region is provided only with a few peripheral circuits. The difference between the pattern densities of these two regions is huge. Furthermore, most of current storage capacitor unit is designed in the form of a pillar-type capacitor protruding from the substrate surface. The height of this kind of capacitor protruding out of the substrate is quite larger (maybe 3000 nm at most). The above-described property of pillar-type memory cell may challenge the planarization step in semiconductor process, since the device in the region with lower pattern density would be removed by relatively more portions and may be, therefore, seriously damaged.

SUMMARY OF THE INVENTION

In the light of above-described problem of poor surface uniformity happening in the planarization process, a novel semiconductor process is provided in the present invention to mitigate the loading effect in planarization caused by density difference between the patterns of different predetermined regions. The process features the advantage of simple, low cost and no additional photolithographic process.

The purpose of the present invention is to provide a semiconductor process for improving loading effects of planarization. The process features the steps of providing a substrate with a first region and a second region, forming multiple first protruding patterns on the first region and the second region of the substrate, wherein a density of the first protruding pattern in the first region is larger than a density of the first protruding pattern in the second region, forming a first dielectric layer on the substrate and the first protruding patterns, wherein the first dielectric layer is provided with multiple second protruding patterns corresponding to the underlying first protruding patterns, forming a second dielectric layer on the first dielectric layer, performing a first planarization process to remove a portion of second dielectric layer and expose top surfaces of the second protruding patterns, performing an etch process to remove the second protruding patterns of first dielectric layer, removing remaining the second dielectric layer, and performing a second planarization process to the first dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
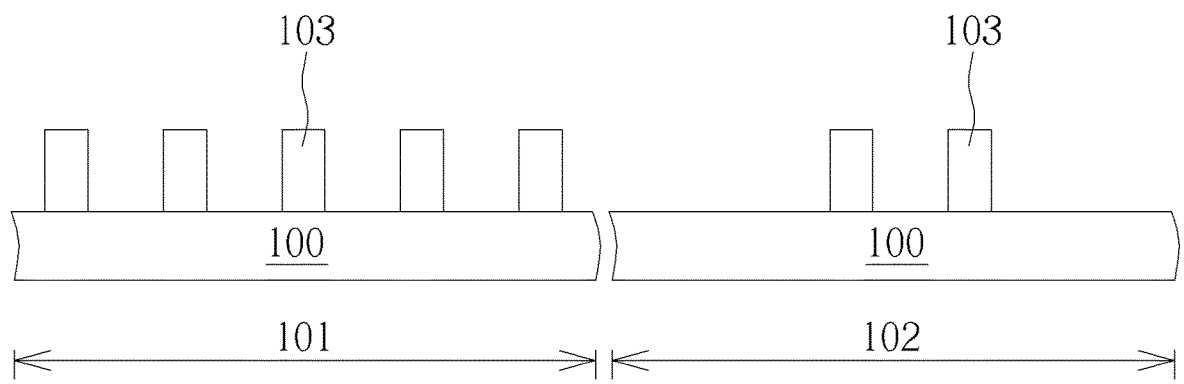
FIG. 1 to FIG. 6 are schematic cross-sections sequentially illustrating the process flow of semiconductor process in accordance with the embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Before describing the preferred embodiment in more detail, further explanation shall be given regarding certain terms that may be used throughout the descriptions. For example, the term "etch" or "etching" is used herein to generally describe a fabrication process of patterning a material, such that at least a portion of the material would remain after the etch is completed. For example, it should be understood that the process of etching silicon involves the steps of patterning a photoresist above the silicon, and then removing the areas of silicon no longer protected by the masking layer. As such, the areas of silicon protected by the mask would remain behind after the etch process is complete. However, in another example, "etching" may also refer to a process that does not use a photoresist, but still leaves behind at least a portion of the material after the etch process is finished.

The above description serves to distinguish the term "etching" from "removing." When etching a material, at least a portion of the material remains behind after the process is completed. In contrast, when removing a material, all of the material is substantially removed in the process. However, in some embodiments, "removing" is considered to be a broad term that may incorporate etching.

The "substrate", "semiconductor substrate" or "wafer" used throughout the descriptions is most commonly thought to be silicon substrate or silicon chip. However, the "substrate" or the "wafer" may also be any of a wide array of semiconductor materials such as germanium (Ge), gallium arsenide (GaAs), indium phosphide (InP), etc. In other embodiments, the "substrate" or the "wafer" may be electrically non-conductive such as a glass or sapphire wafer. There may be various layer structures formed on the substrate. On the basis that no specific functions relevant to the invention are given, the term "substrate" would generalize for all those layer structures. In addition, the term "capacitor" used herein refers to a storage node in the architecture of dynamic random access memory (DRAM), and it may have different names in other electronic devices or memory architecture.

In the drawings of present invention, FIGS. 1-6 are schematic cross-sections sequentially illustrating a process flow of semiconductor process at different steps in accordance with the embodiment of present invention. The connections between components and layer structures and their layout in the view of semiconductor plane are clearly shown in the figures.

Please refer first to FIG. 1 that is a schematic cross-section of layer structures in the beginning of the semiconductor process of the present invention. A semiconductor substrate 100 is first prepared before the process with multiple memory cell regions and periphery regions defined thereon. The cell region and the periphery region are referred to respectively as a first region 101 and a second region 102 in the figure. The substrate 100 maybe a silicon substrate, a silicon-on-insulator (SOI) substrate, a germanium substrate, a germanium-on-insulator (GOI) substrate, a silicon-germanium (SiGe) substrate, etc. In the preferred embodiment of present invention, the substrate 100 may be formed in advance with the devices or structures like word lines, bit lines, source/drain, storage node contact plugs, and material layers for storage node contact pad in memory process. In this regard, since the method of present invention is not focused on those memory processes and relevant components, detailed description of relevant process will not be provided herein in case of obscuring the key features of present invention and complicating the drawings.

Multiple first protruding patterns 103 are formed on the substrate 100. In the embodiment of present invention, these first protruding patterns 103 are storage capacitor structures with cylindrical or pillar-type storage capacitor units especially in the first region 101, but not limited thereto. The first protruding patterns 103 in the second region 102 may be common logic circuit structure, but not limited thereto. Since the present invention is focused on the planarization of semiconductor process and relevant process steps, detailed description of components and process steps of above-mentioned storage capacitor structure will not be provided herein in case of obscuring the key features of present invention.

Please refer again to FIG. 1. It may be seen in the figure that the density of first protruding pattern 103 in the first region 101 is larger than the density of first protruding pattern 103 in the second region 102. This phenomenon reflects that the memory cell-based first region 101 will be provided with multiple closely arranged storage capacitors, while devices and wirings in peripheral circuit-based second region 102 are not arranged so closely as the ones in the first region. This density difference is the major cause of the loading effect happening in a later planarization process and is also the problem the present invention is supposed to solve.

Figure 2:
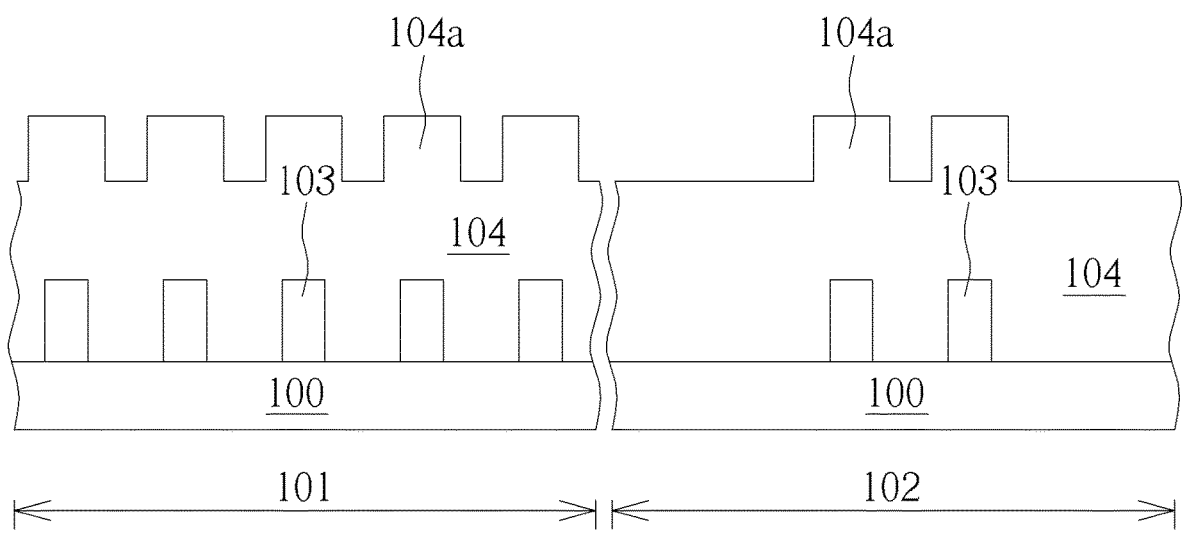

Please refer to FIG. 2. After the first protruding patterns 103 are formed, a first dielectric layer 104, such as a pre-metal dielectric (PMD) layer with a material of tetra-ethoxysilane (TEOS) or spin-on glass (SOG), is formed on the substrate 100 and the first protruding patterns 103. In the embodiment of the present invention, the first dielectric layer 104 is blanketly formed on the first protruding patterns 103 by chemical vapor deposition (CVD), so that the resulting first dielectric layer 104 will be provided with multiple second protruding patterns 104a corresponding to the underlying first protruding patterns 103. Since the density of these first protruding patterns 103 in the first region 101 is larger, the density of these second protruding patterns 104a formed in first region 101 in this step will also be correspondingly large. On the basis of this surface profile, if a conventional approach is adopted in following planarization process, relatively more portions of the second protruding patterns 104a on the second region 102 with smaller pattern density would be removed in comparison to the one in the first region 101 with larger pattern density, so as to make the surface of the two regions uneven.

Figure 3:
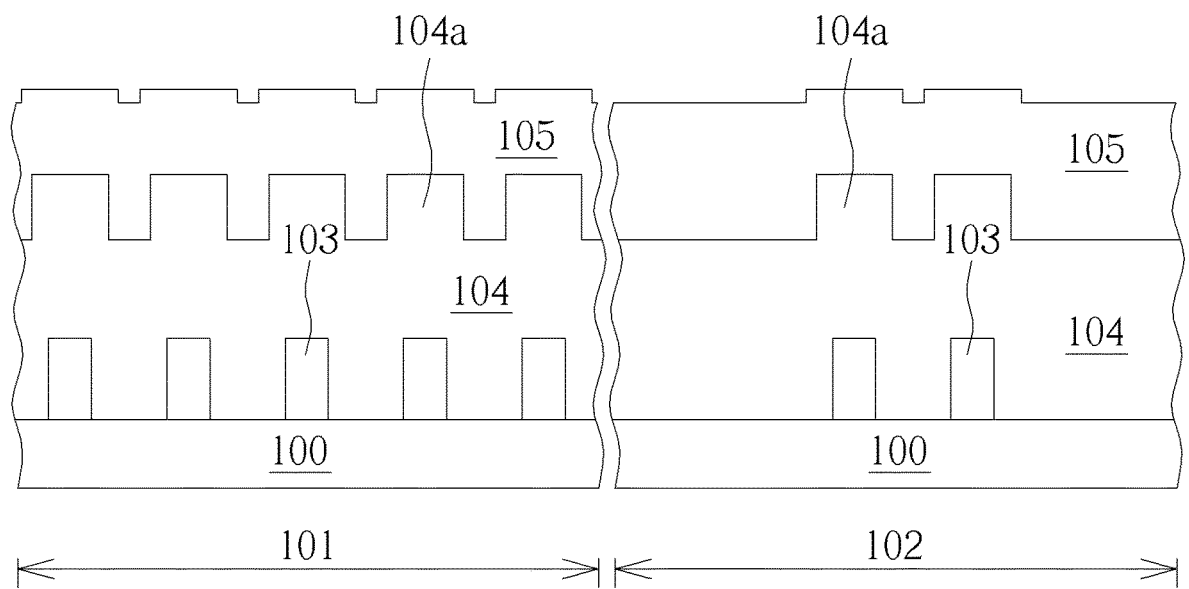

As shown in FIG. 3, in order to solve this problem in the following planarization process, after the first dielectric layer 104 is formed, a second dielectric layer 105 will be subsequently formed on the first dielectric layer 104 by using the material with a polishing rate and an etching rate different from the one of the first dielectric layer 104. The second dielectric layer 105 may be an organic dielectric layer (ODL) formed on the first dielectric layer 104 by using spin coating method. The organic dielectric layer includes organic planarization materials with self-planarization property, and with the composition including carbon, hydrogen, oxygen, nitrogen, fluorine and/or silicon, etc. In certain embodiments, the self-planarization organic material may be polymer with adequately low viscosity, so that the resulting organic material may be formed with a flat top surface. In certain embodiments, the organic dielectric layer may include transparent organic polymer material. The example of organic planarization material includes, but not limited to, CHM701B, HM8006 or HM8014, ODL-102 or ODL-401, etc, with a thickness about 100 nm to 400 nm.

It may be seen in the figure that, due to the spin-coating method and the intrinsic property of organic dielectric layer, the protrusions on the surface of second dielectric layer 105 caused by the pattern features of underlying layer is not so prominent like the one of underlying layer, so as to facilitate the progress of following processes.

Figure 4:
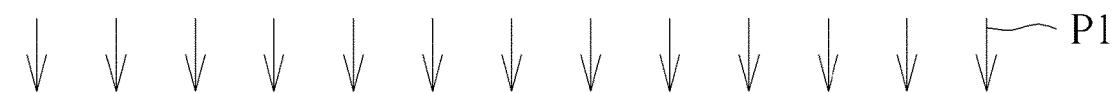
Figure 4:
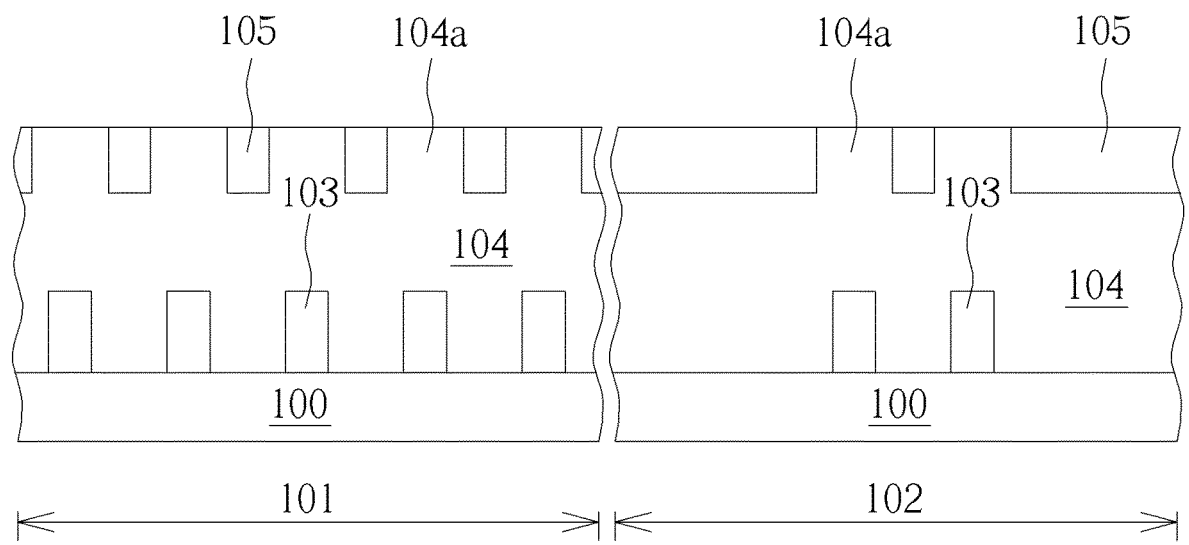

Please refer to FIG. 4. After the smoother second dielectric layer 105 is formed, a planarization process, such as a chemical mechanical planarization (CMP) or etch back process P1, is subsequently performed to remove a portion of the second dielectric layer 105. This planarization process would proceed until the top surface of second dielectric layer 105 is substantially flush with the top surface of the second protruding patterns 104a, with a height difference smaller than 500 Å, and proceeds until the top surfaces of second protruding patterns 104a are exposed. Due to the protruding features of second dielectric layer 105 are not so prominent like the ones of underlying layer and the using of materials of organic dielectric layer, the CMP process P1 may successfully achieve even surfaces in these two regions.

Figure 5:
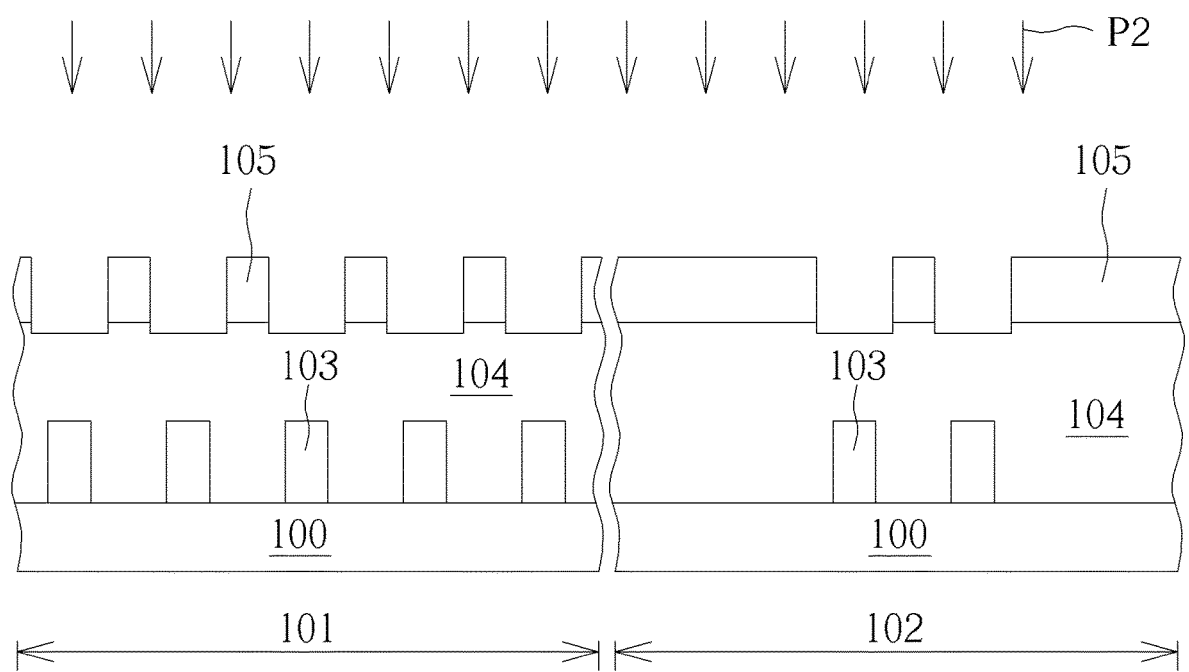

Please refer to FIG. 5. After the CMP process P1 is performed, perform an etch process P2 using remaining second dielectric layer 105 as an etch mask to remove those exposed second protruding patterns 104a. The etching rate of etch process P2 to the first dielectric layer 104 is much larger than (ex. at least triple of) the etching rate of etch process P2 to the second dielectric layer 105. It may be seen in the figure that the etch process P2 would completely remove the second protruding patterns 104a and remain only the underlying flat first dielectric layer 104. Although a portion of the first dielectric layer 104 may be concaved by mild etching effect after the etch process P2, the surface flatness of first dielectric layer 104 after the etch process would be generally controlled at a level less than 3%, which is a quite improved surface flatness in comparison to the one of originally-formed first dielectric layer 104 in FIG. 2. The purpose of this step is to remove the over protruding features before the planarization of target layer in order to achieve the desired surface flatness through the planarization process.

Figure 6:
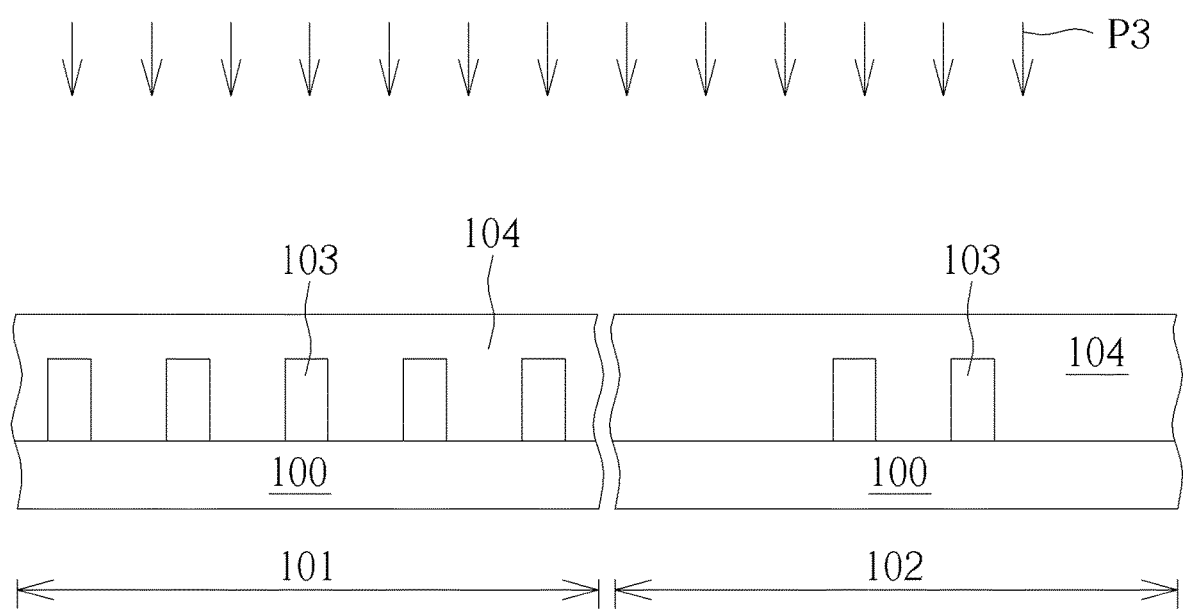

Please refer to FIG. 6. After the second protruding patterns 104a are removed, the remaining second dielectric layer 105 on the first dielectric layer 104 is completely removed by an ashing process to expose entire first dielectric layer 104 with a smoother surface. Another CMP process P3 is then performed to the target of this smoother first dielectric layer 104, so as to obtain the first dielectric layer 104 with completely flat surface.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process for improving loading effects in planarization, comprising:
    providing a substrate with a first region and a second region;
    forming multiple first protruding patterns on said first region and said second region of said substrate, wherein a density of said first protruding pattern in said first region is larger than a density of said first protruding pattern in said second region;
    forming a first dielectric layer on said substrate and said first protruding patterns, wherein said first dielectric layer is provided with multiple second protruding patterns corresponding to underlying said first protruding patterns;
    forming a second dielectric layer on said first dielectric layer;
    performing a first planarization process to remove a portion of said second dielectric layer and expose top surfaces of said second protruding patterns;
    performing an etch process to remove said second protruding patterns of said first dielectric layer;
    removing remaining said second dielectric layer; and
    performing a second planarization process to said first dielectric layer.

2. The semiconductor process for improving loading effects in planarization of claim 1, wherein said first region is memory cell region and said second is peripheral region.

3. The semiconductor process for improving loading effects in planarization of claim 1, wherein said first protruding patterns are storage capacitor structure.

4. The semiconductor process for improving loading effects in planarization of claim 1, wherein said first dielectric layer is pre-metal dielectric layer.

5. The semiconductor process for improving loading effects in planarization of claim 1, wherein a material of said first dielectric layer comprises tetraethoxysilane (TEOS) or spin on glass (SOG).

6. The semiconductor process for improving loading effects in planarization of claim 1, wherein said second dielectric layer is organic dielectric layer (ODL).

7. The semiconductor process for improving loading effects in planarization of claim 1, wherein said first planarization process removes a portion of said second dielectric layer, so that a height difference between a top surface of said second dielectric layer and top surfaces of said second protruding patterns is smaller than 500 Å.

8. The semiconductor process for improving loading effects in planarization of claim 1, wherein an etching rate of said etch process to said first dielectric layer is larger than an etching rate of said etch process to said second dielectric layer.

9. The semiconductor process for improving loading effects in planarization of claim 8, wherein said etching rate of said etch process to said first dielectric layer is triple of said etching rate of said etch process to said second dielectric layer.

10. The semiconductor process for improving loading effects in planarization of claim 1, wherein said etch process removes a portion of said first dielectric layer under said second protruding patterns.

* * * * *